United States Patent
Hu

(10) Patent No.: US 12,191,192 B2
(45) Date of Patent: Jan. 7, 2025

(54) METHOD OF FORMING ENGINEERED WAFERS

(71) Applicant: Bing Hu, Dallas, TX (US)

(72) Inventor: Bing Hu, Dallas, TX (US)

( * ) Notice: Subject to any disclaimer, the term of this patent is extended or adjusted under 35 U.S.C. 154(b) by 0 days.

(21) Appl. No.: 16/201,821

(22) Filed: Nov. 27, 2018

(65) Prior Publication Data
US 2020/0058542 A1    Feb. 20, 2020

Related U.S. Application Data

(63) Continuation-in-part of application No. 15/868,300, filed on Jan. 11, 2018, now Pat. No. 10,734,274.

(30) Foreign Application Priority Data

Aug. 17, 2018 (CN) .......................... 201810940626.9
Sep. 18, 2018 (CN) ............................ 201510599390

(51) Int. Cl.
| | | |
|---|---|---|
| H01L 21/762 | (2006.01) | |
| H01L 21/02 | (2006.01) | |
| H01L 29/45 | (2006.01) | |
| H01L 29/47 | (2006.01) | |
| H01L 33/00 | (2010.01) | |

(52) U.S. Cl.
CPC .... *H01L 21/76254* (2013.01); *H01L 21/0254* (2013.01); *H01L 21/0262* (2013.01); *H01L 21/02631* (2013.01); *H01L 29/456* (2013.01); *H01L 29/47* (2013.01); *H01L 33/0093* (2020.05)

(58) Field of Classification Search
CPC ..................... H01L 21/76254; H01L 33/0079
See application file for complete search history.

(56) References Cited

U.S. PATENT DOCUMENTS

| | | |
|---|---|---|
| 5,374,564 A | 12/1994 | Bruel |
| 6,540,827 B1 | 4/2003 | Levy et al. |
| 6,995,075 B1 | 2/2006 | Usenko |
| 8,759,951 B2 | 6/2014 | Mitani |
| 10,734,274 B2 | 8/2020 | Hu |

(Continued)

FOREIGN PATENT DOCUMENTS

| | | |
|---|---|---|
| CN | 101106067 A | 1/2008 |
| EP | 1361298 | 12/2003 |

(Continued)

OTHER PUBLICATIONS

Tauzin, "Transfer of Two-Inch Gan Film By the Smart Cut Technology," 207th ECS Meeting, 1 page.

(Continued)

*Primary Examiner* — Evan G Clinton
(74) *Attorney, Agent, or Firm* — Chad Peterson

(57) ABSTRACT

Ions are implanted into a first wafer through a top side, generating an ion damaged layer underneath the substrate film of the first wafer. A stress inducing layer is applied on a surface on the top side of the first wafer on one of the ion implanted side and the opposite side. The substrate film is separated from the first wafer at the ion damaged layer. the separated substrate film is bonded to a second wafer at a surface on one of a first side and a second side that this opposite of the first side of the second wafer to form an engineered wafer.

18 Claims, 13 Drawing Sheets

(56) References Cited

U.S. PATENT DOCUMENTS

| | | | |
|---|---|---|---|
| 2001/0009250 A1 | 7/2001 | Herman et al. | |
| 2003/0181001 A1* | 9/2003 | Aga | H01L 21/76254 438/200 |
| 2005/0227456 A1 | 10/2005 | Roche | |
| 2006/0205179 A1 | 9/2006 | Fournel et al. | |
| 2006/0226482 A1* | 10/2006 | Suvorov | H01L 21/265 257/347 |
| 2007/0249140 A1* | 10/2007 | Dross | H01L 21/30 438/458 |
| 2008/0169508 A1 | 7/2008 | Chidambarrao et al. | |
| 2009/0035885 A1 | 2/2009 | Karlicek, Jr. et al. | |
| 2009/0061557 A1 | 3/2009 | Akiyama et al. | |
| 2009/0071394 A1 | 3/2009 | Nakahata et al. | |
| 2009/0117711 A1* | 5/2009 | Harle | H01L 33/0093 257/E21.002 |
| 2009/0149005 A1 | 6/2009 | Tauzin et al. | |
| 2009/0242032 A1 | 10/2009 | Yamazaki et al. | |
| 2010/0109126 A1 | 5/2010 | Arena | |
| 2010/0311250 A1 | 12/2010 | Bedell et al. | |
| 2011/0132549 A1 | 6/2011 | Sercel et al. | |
| 2011/0156212 A1 | 6/2011 | Arena | |
| 2011/0244654 A1 | 10/2011 | Akiyama et al. | |
| 2012/0028399 A1 | 2/2012 | Moslehi et al. | |
| 2012/0119219 A1 | 5/2012 | Takado et al. | |
| 2012/0326169 A1 | 12/2012 | Sakai | |
| 2014/0252366 A1 | 9/2014 | Gao | |
| 2014/0327013 A1 | 11/2014 | Schenk et al. | |
| 2015/0243551 A1* | 8/2015 | Barthelemy | H01L 21/76259 438/458 |
| 2015/0368833 A1 | 12/2015 | Farah | |
| 2016/0336233 A1 | 11/2016 | Yonehara et al. | |
| 2016/0372628 A1* | 12/2016 | Henley | H01L 21/7813 |
| 2017/0107606 A1 | 4/2017 | Jinbo et al. | |
| 2017/0309249 A1 | 10/2017 | Yamazaki et al. | |
| 2017/0372965 A1 | 12/2017 | Nishibayashi et al. | |
| 2018/0158720 A1 | 6/2018 | Hu | |
| 2018/0330983 A1 | 11/2018 | Wang et al. | |
| 2018/0350785 A1* | 12/2018 | Fong | H01L 24/94 |
| 2020/0058542 A1 | 2/2020 | Hu | |

FOREIGN PATENT DOCUMENTS

| | | |
|---|---|---|
| JP | 2002-241191 | 8/2002 |
| JP | 2006-509377 | 3/2006 |
| JP | 2007-250575 | 9/2007 |
| JP | 2008-522398 | 6/2008 |
| JP | 2011-249775 | 12/2011 |
| JP | 2015-119062 | 6/2015 |

OTHER PUBLICATIONS

Di Cioccio, "Silicon carbide on insulator formation using the Smart Cut process," Electronics Letters vol. 32 No. 12 (Jun. 6, 1996), pp. 1144-1145.

Larheche, "AlGaN / GaN HEMT structures grown on SiCOI wafers obtained by the Smart Cut ™ technology," Materials Science Forum vols. 457-460 (2004), pp. 1621-1624.

Henttinen, "Transfer of Thin Si Layers by Cold and Thermal Ion-Cutting," Journal of Material Science: Materials in Electronics vol. 14 (2003), pp. 299-303.

Bouchard, "Analysis of stress intensity factors and T-stress to control crack propagation for kerf-less spalling of single crystal silicon foils," Computational Materials Science 69 (Mar. 2013), pp. 243-250.

Martini, "Epoxy-induced spalling of Silicon," Energy Procedia 27 (2012), pp. 567-572.

Bedell, "Kerf-Less Removal of Si, Ge, and III-V Layers by Controlled Spalling to Enable Low-Cost PV Technologies," IEEE Journal of Photovoltaics vol. 2 No. 2 (Apr. 2012), pp. 141-147.

Niepelt, "Kerfless exfoliated thin crystalline Si wafers with Al metallization layers for solar cells," Journal of Materials Research Nov. 2015, 36 pages.

Bedell, "Layer transfer by controlled spalling," Journal of Physics D Applied Physics 46 (Mar. 2013), 8 pages.

Bedell, "Vertical Light-Emitting Diode Fabrication by Controlled Spalling," Applied Physics Express 6 (2013), 4 pages.

Written Opinion of the International Searching Authority for PCT/CN2016/098943 (Translation); Dec. 19, 2016; 5 pages.

International Search Report for PCT/CN2016/098943 (Translation); Dec. 19, 2016; 3 pages.

Budde, "Hydrogen-Related Defects in Proton-Implanted Silicon and Germanium," Thesis, Institute of Physics and Astronomy, University of Aarhus, Denmark (Oct. 1998), 159 pages.

Amarasinghe, "Optimization of H+ Implantation Parameters for Exfoliation of 4H-SiC Films," ECS Transactions (Mar. 2013), pp. 341-348.

Goorsky (Ed.), "Ion Implantation," InTech (2012), Rijeka, Croatia, 448 pages.

Communication from European Patent Office re EP16845712, Mar. 20, 2019; 6 pages.

Notification of Reasons for Refusal from Japanese Patent Office re 2018-524527 (Translation), Jan. 8, 2019, 3 pages.

Jia, "Freestanding ultrathin single-crystalline SiC substrate by MeV H ion-slicing," Applied Physics Letters (2018), 7 pages.

Chichkov, "Femtosecond, picosecond and nanosecond laser ablation of solids," Applied Physics A (1996), 7 pages.

Ozel, "Nanosecond Pulsed Laser Processing of Ion Implanted Single Crystal Silicon Carbide Thin Layers," Physics Procedia 56 (2014), 11 pages.

Beyer, "Cold split—A new technology for kerf-less wafering of Silicon," Freiberg Silicon Days 2015, 12 pages.

Sun, "Generic Incubation Law for Laser Damage and Ablation Thresholds," Journal of Applied Physics 117, 073102 (2015), 7 pages.

Barcz, "Diffusion and impurity segregation in hydrogen-implanted silicon carbide," Journal of Applied Physics (Jun. 2014), 11 pages.

Swoboda, "Laser Assisted SiC Wafering Using Cold Split," Material Science Forum vol. 897 (May 2017), 4 pages.

Hu, "Separation of a Functional Film from a SiC Substrate by Ion Cut without Bonding," 2018 International Flexible Electronics Technology Conference, 3 pages.

Bedell, "Layer transfer of bulk gallium nitride by controlled spalling," Journal of Applied Physics 122, 025103 (2017), 7 pages.

Desautels, "Femtosecond Laser Damage Threshold and Nonlinear Characterization in Bulk Transparent SiC Materials," Proc. of SPIE vol. 6875, (2008), 14 pages.

Notification of Reasons for Refusal from Japanese Patent Office re 2018-524527 (Translation), May 22, 2019, 4 pages.

Communication from German Patent Office, Jul. 22, 2019, 7 pages.

International Search Report, Apr. 21, 2020, 2 pages.

Written Opinion of the International Searching Authority, Apr. 21, 2020, 6 pages.

Gupta et al., "Ultra-thin chips for high-performance flexible electronics," npj Flexible Electronics (2018).

Jayswal et al., "Overview On Flexible Electronics Technology," Journal of Advanced Computing and Communication Technologies (ISSN: 2347-2804) vol. No. 5 Issue No. 3, Jun. 2017.

Cai et al., "Review on flexible photonics/electronics integrated devices and fabrication strategy," Science China Information Sciences 61, 060410 (2018).

Communication from Korean patent office, Jun. 5, 2020, 6 pages (with translation).

"Controlled spalling of bulk and free-standing gallium nitride substrates," Semiconductor Today, vol. 12 Issue 7 (Sep. 2017).

"Thinking Thin Brings New Layering and Thermal Abilities to the Semiconductor Industry," AIP Publishing (Jul. 11, 2017).

"Controlled spalling fabricates thin films of gallium nitride and could drastically change semiconductor industry," The American Ceramic Society (Jul. 18, 2017).

Communication from Korean patent office, Dec. 29, 2020, 7 pages (with translation).

Communication from Japanese patent office re 2019-184892, Dec. 16, 2020, 3 pages (with translation).

Communication from Japanese patent office re 2019-184892, Jul. 8, 2021, 3 pages (with translation).

(56) References Cited

OTHER PUBLICATIONS

Office action re U.S. Appl. No. 16/505,610, Nov. 20, 2020, 6 pages.
Office action re U.S. Appl. No. 16/505,610, Apr. 2, 2021, 7 pages.

* cited by examiner

METHOD OF FORMING ENGINEERED WAFERS

CROSS-REFERENCE TO RELATED APPLICATIONS

This Application is a continuation-in-part of U.S. patent application Ser. No. 15/868,300, which is a continuation of International Application No. PCT/CN2016/098943 filed Sep. 14, 2016, which claims priority to Chinese Application No. 201510599390 filed in Sep. 18, 2015. This Application also claims priority to CHINESE APPLICATION: 201810940626.9 filed on Aug. 17, 2018. The disclosures of these applications including the specifications, the drawings, and the claims are hereby incorporated by reference in their entirety.

TECHNICAL FIELD

The present disclosure is related to the field of manufacturing electronic devices, and in particular, to separating a substrate film from a first wafer and forming an engineered wafer by bonding the separated substrate film to the bottom or top surface of a second wafer.

BACKGROUND

Semiconductor materials are widely used for making electronic devices. The applications of semiconductor materials are directly related to our daily lives and in technology. Semiconductor materials have evolved from silicon or germanium (for example) in the first generation to more recent third generation materials such as silicon carbide (SiC) and gallium nitride (GaN). All electronic devices based on semiconductors are built on semiconductor substrates, and the pricing of electronic devices is a function of the cost of substrates. Generally, the first and second generation semiconductor substrates are grown from their respective melt, while the third generation semiconductor substrates are mostly grown from vapors, such as chemical vapor deposition(CVD), metalorganic chemical vapor deposition (MOCVD), physical vapor transport(PVT), hydride vapor phase epitaxy(HVPE), and such. The substrate costs of third generation semiconductor are much higher than in previous generations. As such, reducing the cost of substrates will benefit consumers of electronic devices, and prompt more applications, especially those based on the 3rd generation semiconductors.

Ion cut (i.e. smart-cut) technique was developed for producing silicon-on-insulator (SOI) wafer substrates in the 1990s. The ion cut actually includes ion cut and film transfer, using ion implantation to separate a film layer from its main substrate. The SOI fabrication process includes first forming a silicon dioxide film with thickness in the order of a few micro-meters on the donor silicon substrate. Next, hydrogen ions are implanted into the silicon substrate through the silicon dioxide to reach the silicon substrate and stays in the silicon substrate, which cause an ion damaged layer in silicon. The depth of ion damaged layer under surface is determined by the ion acceleration voltage. That is, the higher the acceleration volts, the deeper the ions can travel into the substrate. The depth of the ion damaged layer under the surface of the silicon substrate usually ranges from a micrometer to twenty some micrometers. A bonding process follows the ion implantation step, in which an acceptor silicon substrate is bonded to the donor silicon substrate on the silicon dioxide surface. Bonded substrates are then annealed at temperatures of 200-500° C. The hydrogen ions in ion damaged layer agglomerate into hydrogen gas during the annealing. The hydrogen gas extends along the ion damaged layer and causes the separation of the donor substrate from acceptor substrate at the ion damaged layer. The donor wafer can then be reused. The acceptor wafer undergoes further heat annealing to rearrange the silicon atoms on the separate surface. The surface atom rearrangement eliminates the ion damage. A silicon film of a few micrometers in thickness lies above the silicon dioxide layer. Electronic devices can then be built on this silicon film. The acceptor substrate only supports the silicon film and silicon dioxide layers above it. The acceptor substrate, with Si film and SiO2 layer on it, is the SOI substrate. The ion cut technique has also been attempted on other semiconductor materials to transfer film. To reduce substrate cost for SiC and GaN, great efforts were made to transfer SiC and GaN film to Si or oxide substrates by means of ion cut. In contrast from the SOI process, there is no requirement to form an oxide layer on GaN or SiC, because they are usually transferred on insulators. In the ion cut process, there are some important factors such as implanted ion dosage, depth of implanted ions, bonding of acceptor substrate to donor substrate, and annealing after bonding. Among these factors, bonding of the acceptor substrate to the donor substrate is critical to the success of ion cut and film transfer. If donor and acceptor wafers are not bonded very well, the film to be transferred can be broken during annealing or separation due to lack of support from the acceptor wafer. To achieve satisfactory bonding, the bonding surface of substrates must be very flat. Getting the surface of SiC substrate to meet the bonding requirements is very challenging because of the hardness of SiC. In addition, the separated surface in a normal ion cut process needs a further process like heat annealing or polishing to repair damage to the surface and to allow electronic devices to be formed thereon.

In last a few years Stephen W. Bedell, et. al., successfully separated Si, Ge, GaAs, and GaN films from their respective substrates by means of a controlled spalling. The process of controlled spalling includes first coating a stress inducing layer on top of a semiconductor substrate first, and then putting a tape on the stress inducing layer. By pulling the tape, a film of substrate attached to the stress inducing layer is separated from the main body of the substrate. The thickness of the film that is separated from the substrate is controlled by stress in the stress inducing layer. This thickness control method may cause difficulty in large scale production. Furthermore, there is no reported application of controlled spalling on hard substrate materials such as SiC although it can be done theoretically.

SUMMARY

According to an embodiment, a method of forming a semiconductor engineered wafer includes: implanting ions into a first wafer through a top side, generating an ion damaged layer underneath the substrate film of the first wafer; applying a stress inducing layer on a surface on the top side of the first wafer on one of the ion implanted side and the opposite side; separating the substrate film from the first wafer at the ion damaged layer; and bonding the separated substrate film to a second wafer at a surface on one of a first side and a second side that this opposite of the first side of the second wafer.

According to an embodiment, the bonding step may be performed using either direct wafer bonding or wafer boding with intermediate materials.

According to an embodiment, materials for the first wafer can be one of $Si_1Ge_1-x$, $In_xGa_{1-x}As$, $In_xGa_{1-x}P$, $In_xGa_yAl_{1-x-y}N$, CdTe, ZnO, and $Ga_2O_3$, where the x≤1, y≤1 and 1−y≤1 when bonding the first wafer to the first side of the second wafer.

According to an embodiment, the first wafer is formed of one of Si, sapphire, ceramics, poly crystalline SiC, quartz, glass, and metals when bonding to the second side of the second wafer.

According to an embodiment, the implanted ion can be one of H, He, N, and O.

According to an embodiment, a functional layer is formed on the substrate film of the first wafer prior to applying the stress inducing layer.

According to an embodiment, prior to implanting ions in the first wafer, a functional layer is formed on a surface of the top side of the first wafer such that the ions are then implanted through the functional layer.

DETAILED DESCRIPTION

Figure 1:
FIG. 1 is a schematic cross-sectional illustration of a semiconductor substrate, in accordance with an embodiment of the present disclosure.

While the present disclosure is described herein by way of example using embodiments and illustrative drawings, those skilled in the art will recognize that the disclosure is not limited to the embodiments of drawing or drawings described, and are not intended to represent the scale of the various components. Further, some components that may form a part of the disclosure may not be illustrated in certain figures, for ease of illustration, and such omissions do not limit the embodiments outlined in any way. It should be understood that the drawings and detailed description thereto are not intended to limit the disclosure to the particular form disclosed, but on the contrary, the disclosure is to cover all modifications, equivalents, and alternatives falling within the scope of the present disclosure as defined by the appended claims. As used throughout this description, the word "may" is used in a permissive sense (i.e. meaning having the potential to), rather than the mandatory sense, (i.e. meaning must). Furthermore, the terminology and phraseology used herein is solely used for descriptive purposes and should not be construed as limiting in scope. Language such as "including," "comprising," "having," "containing," or "involving," and variations thereof, is intended to be broad and encompass the subject matter listed thereafter, equivalents, and additional subject matter not recited, and is not intended to exclude other additives, components, integers or steps. Likewise, the term "comprising" is considered synonymous with the terms "including" or "containing" for applicable legal purposes. Any discussion of documents, acts, materials, devices, articles and the like is included in the specification solely for the purpose of providing a context for the present disclosure. It is not suggested or represented that any or all of these matters form part of the prior art base or were common general knowledge in the field relevant to the present disclosure.

In this disclosure, whenever a composition or an element or a group of elements is preceded with the transitional phrase "comprising", it is understood that we also contemplate the same composition, element or group of elements with transitional phrases "consisting of", "consisting", "selected from the group of consisting of, "including", or "is" preceding the recitation of the composition, element or group of elements and vice versa.

The present disclosure is described hereinafter by various embodiments with reference to the accompanying drawing, wherein reference numerals used in the accompanying drawing correspond to the like elements throughout the description. This disclosure may, however, be embodied in many different forms and should not be construed as being limited to the embodiments set forth herein. Rather, the embodiments are provided such that this disclosure will be thorough and complete and will fully convey the scope of the disclosure to those skilled in the art. In the following detailed description, numeric values and ranges are provided for various aspects of the implementations described. These values and ranges are to be treated as examples only, and are not intended to limit the scope of the claims. In addition, a number of materials are identified as suitable for various facets of the implementations. These materials are to be treated as exemplary and are not intended to limit the scope of the disclosure.

Compared to the controlled spalling technique previously discussed, embodiments described below allow controlling the thickness of the film to be separated from the substrate by means of ion implantation and the stress in the stress-inducing layer does not need to be precisely controlled, which makes good for large scale production. The embodiments of the present disclosure have no need of using tape on the stress inducing layer. The stress inducing layer may be thicker than that used in controlled spalling and provide support to the film. Furthermore, embodiments of the present disclosure may also be applied for separating hard semiconductor substrates like SiC. Another potential advantage of the embodiments of the present disclosure may be the fewer separation defects than from spalling techniques because the ion damaged layer is introduced earlier.

The numbers in the figures represent each parts as follows:

1) semiconductor substrate (i.e. wafer); 2) the main body of semiconductor substrate; 3) ion damaged layer; 4) substrate film; 5) epitaxial layer; 51) the first epitaxial layer; 52) the second epitaxial layer; 53) the third epitaxial layer; 54) the fourth epitaxial layer; 6) the stress inducing layer; 7) operation layer; and 8) stiff substrate.

The detailed description and drawings of the present disclosure are only for further explanations of the principles and specialties of the patent. They do not restrict the ranges of this patent therein.

Figure 2:
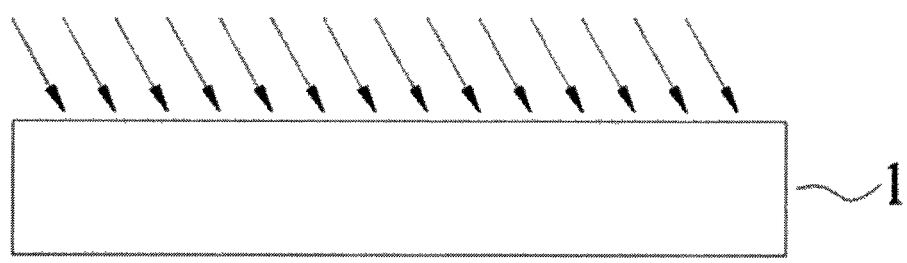
FIG. 2 is a schematic cross-sectional illustration of ions being implanted through a top surface of the semiconductor substrate, in accordance with an embodiment of the present disclosure.
Figure 3:
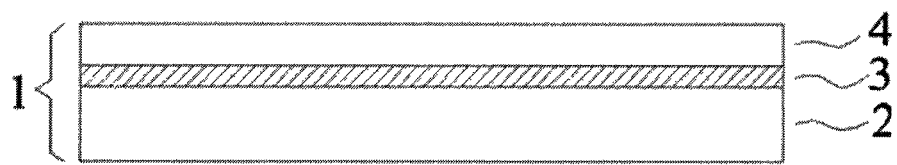
FIG. 3 is a schematic cross-sectional illustration of the semiconductor substrate with an ion damaged layer after ion implantation, in accordance with an embodiment of the present disclosure.

FIG. 1 is a schematic cross-sectional illustration of a semiconductor substrate 1, in according to an embodiment of the present disclosure, and FIG. 2 is a schematic cross-sectional illustration of ions being implanted through a top surface of the semiconductor substrate 1, according to an embodiment of the present disclosure. For discussion, the side of the wafer through which the ions are implanted will be referred throughout the embodiments as "the first side", and the opposite side of the wafer will be referred throughout the embodiments as "the second side". FIG. 3 is a cross-sectional illustration of the semiconductor substrate with an ion damaged layer after ion implantation, in accordance with an embodiment of the present disclosure. After ion implantation, the semiconductor substrate 1 is divided into layers, including: a main body 2, an ion damaged layer 3 above the main body, and a substrate film 4 above the ion damaged layer 3. According to an embodiment, the semiconductor substrate 1 may be a piece of a mono-crystalline semiconductor, a piece of a mono-crystalline semiconductor with an epitaxial semiconductor layer on it, or a piece of a mono-crystalline material other than a semiconductor including oxide with an epitaxial semiconductor layer on it. The ions are implanted through the surface of semiconductor substrate. The implanted ions include at least one of H, He, Ar, Ne, N, and O and such or their gas ions.

According to an embodiment, ions are implanted through the top surface of semiconductor substrate 1. According to an embodiment, the ion implantation depth may range from 0.1 to 100 µm, preferably at 5 µm, 10 µm, 15 µm, or 20 µm. The implanted ions under the surface of the semiconductor substrate 1 form an ion damaged layer 3. A functional layer may be directly formed on the substrate film 4. In this particular embodiment, the functional layer are electronic devices, such as MOS or MOSFET. A stiff substrate 8 may be adhesive on the electronic devices. The stiff substrate may be semiconductor, oxide crystal, metal, glass or ceramic materials. A pulling force is applied to separate the main body 2 of the semiconductor substrate from the substrate film 4 at the ion damaged layer 3. The force applied for separation is much larger than there is with the stress inducing layer 6. The function layer may be partially finished electronic devices fabricated on substrate film 4 before separation. The rest of fabrication for electronic devices on substrate film 4 may be performed after separation.

According to another embodiment, ions may be implanted through the top surface of semiconductor substrate 1. The ion implantation depth may range from 0.5 to 50 µm, preferably at 5 µm, 10 µm, 15 µm, or 20 µm. The implanted ions under the surface of the semiconductor substrate 1 form an ion damaged layer 3. The functional layer is formed on the surface of substrate film 4 through which the ions are implanted. The functional layer in this embodiment is either an epitaxial semiconductor layer 5 grown on the top surface of semiconductor substrate 1, or the epitaxial layer 5 with electronic devices fabricated thereon. The epitaxial semiconductor layer 5 may be formed by means of CVD, PECVD, MOCVD, MBE, HVPE, PVT or LPE.

Figure 5:
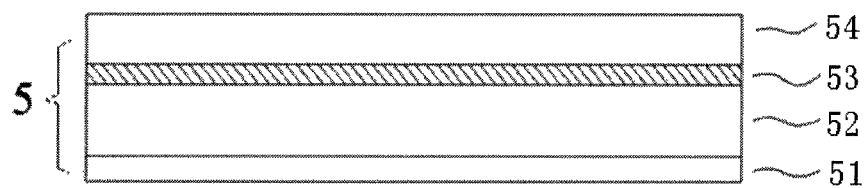
FIG. 5 is a schematic cross-sectional illustration of an epitaxial layer, in accordance with an embodiment of the present disclosure.

According to an embodiment, the epitaxial semiconductor layer 5 may be a single structure or composed of multiple structures. The epitxial semiconductor layer 5 may include at least one of Si, Ge, $Si_xGe_{1-x}$, SiC, GaAs, InP, $In_xGa_{1-x}As$, CaTe, AlN, GaN, InN, or $Al_xIn_yGa_{1-x-y}N$, where $0 \leq x \leq 1$, $0 \leq y \leq 1$, $0 \leq 1-x-y \leq 1$. According to an embodiment, x and y can vary gradually or abruptly in the epitaxial semiconductor layer of $Al_xIn_yGa_{1-x-y}N$. The conductivity and conductive type such as p or n type in epitaxial semiconductor layer 5 may be controlled by means of dopants. As shown in FIG. 5, the epitaxial semiconductor layer 5 may include the first epitaxial layer 51, the second epitaxial layer 52, the third epitaxial layer 53 and the fourth epi layer 54. Using a LED structure as one example, the first epitaxial layer 51 is AlN, the second epitaxial layer 52 is n-type GaN, the third epitaxial layer 53 includes multiple quantum wells $In_xGa_{1-x}N$ and barriers GaN (here $0 \leq x \leq 1$), and the fourth epitaxial layer 54 is p-type GaN. This is merely one example application of an epitaxial layer and is not meant to restrict the epitaxial structures and applications covered within the scope of the present disclosure.

Figure 6:
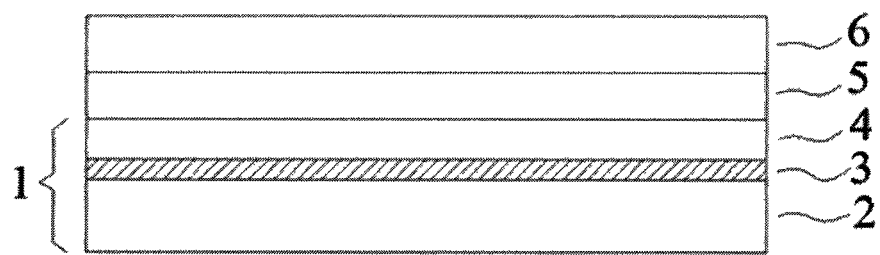
FIG. 6 is a schematic cross-sectional illustration of a stress inducing layer formed on the epitaxial layer, in accordance with an embodiment of the present disclosure.

According to an embodiment, the stress inducing layer 6 is formed on epitaxial semiconductor layer 5 as illustrated in FIG. 6. The stress inducing layer 6 is subjected to a tensile stress. According to an embodiment, the stress inducing layer 6 may be formed by means of vapor coating, sputtering, electroplating, brush coating, spin coating and such. According to an embodiment, the stress inducing layer 6 may be formed of metallic material, including at least one of Ni, Au, Cu, Pd, Ag, Al, Sn, Cr, Ti, Mn, Co, Zn, Mo, W, Zr, V, Pt, and Fe. The function of the stress inducing layer 6 is to introduce compressive stress in the functional layer (i.e., the epitaxial layer 5 in this embodiment) such that the main body 2 and the substrate film 4 can be separated. According to an embodiment, the stress inducing layer 6 may be composed of a non-metal polymer such as epoxy. The epoxy stress inducing layer may be baked and dried at 150° C. According to an embodiment, stress may be generated during cooling down to separate the functional layer from the main body 2 because the coefficients of thermal expansion of functional layer and stress inducing layer are different. Similarly, with room temperature dried epoxy stress inducing layer, reducing temperature to liquid nitrogen temperature has a similar separation effect. The stress inducing layer 6, when metallic, may also function as an Ohmic contact or Schottky contact layer when it is metallic. For example, the stress layer above p-GaN in LED structure may function as an Ohmic electrode while the stress inducing layer above n-type epitaxial layer for SiC diode can function as a Schottky contact layer.

Figure 9:
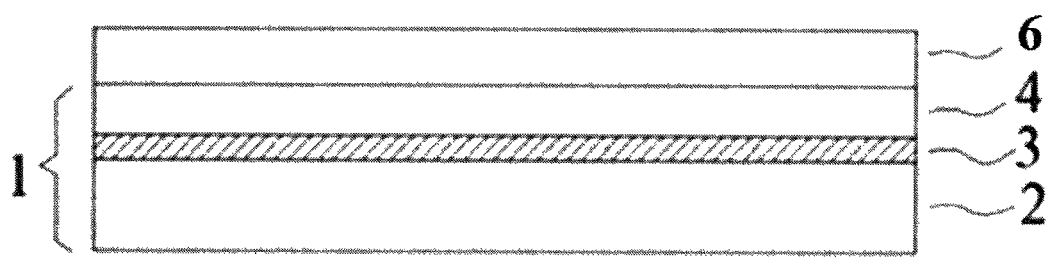
FIG. 9 is a schematic cross-sectional illustration of a stress inducing layer formed on the substrate film.

According to an embodiment, the stress inducing layer 6 is formed on the substrate film 4 without the functional layer 5 (an epi layer in current drawings) being formed on the substrate film 4, as illustrated in FIG. 9. As such, the separation techniques described in the present disclosure may be applied to lift (i.e. separate) a functional layer 5 or a blank substrate film 4 (before the functional layer 5 is formed) from the main body 2 of substrate 1. The lifted film 4 or functional layer 5 can be transferred to another substrate 31 for further process with or without smoothing the separated surface depending on how the film is bonded to the substrate 31. The stress layer can then be removed by etching, heating or by solvent depending on the stress inducing layer materials. In some applications, if the device fabrication has been finished, the stress inducing layer can be kept, especially when metallic stress inducing layer functions as Ohmic or Schottky contact layer.

Figure 7:
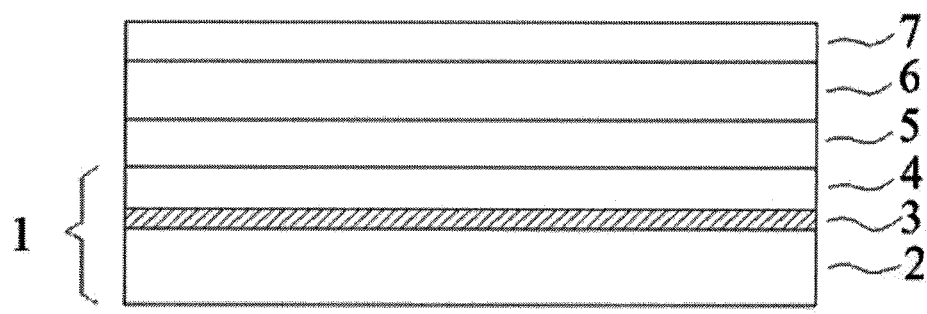
FIG. 7 is a schematic cross-sectional illustration of an operational layer formed on the stress inducing layer, in accordance with an embodiment of the present disclosure.
Figure 8:
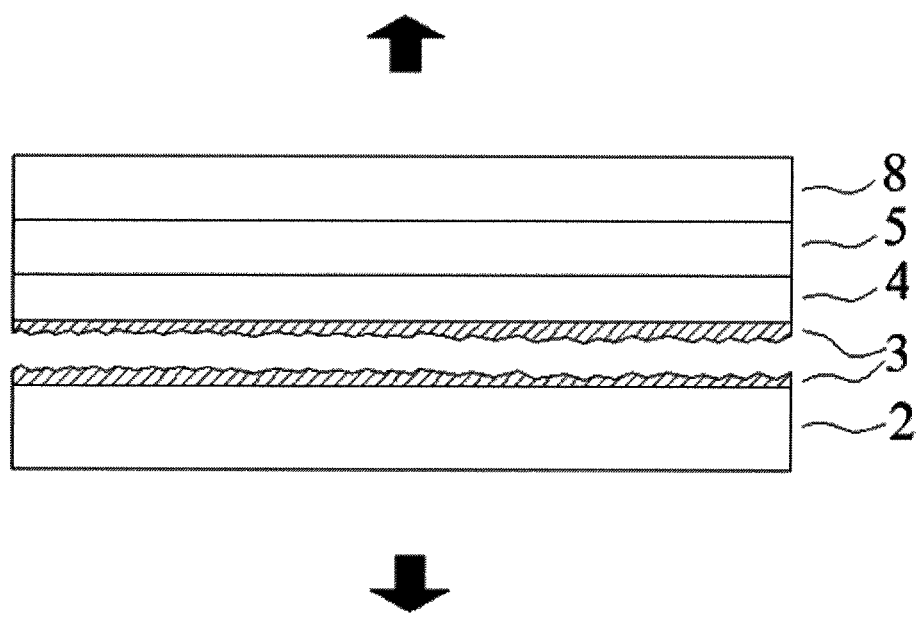
FIG. 8 is a schematic cross-sectional illustration of separating a functional layer from the main body of the substrate with a stiff substrate glued on the epitaxial layer, in accordance with an embodiment of the present disclosure.

FIG. 7 is a schematic cross-sectional illustration of an operational layer 7 formed on the stress inducing layer 6, in accordance with an embodiment of the present disclosure. According to an embodiment, the operational layer 7 is formed on stress inducing layer 6. The purpose of operational layer 7 is for convenient handling during separation. According to an embodiment, the operational layer 7 may be made of soft material such as tape or polymer, or stiff materials such as semiconductor, oxide, metal, glass or ceramics. According to an embodiment, the operational layer 7, which acts as a supporting layer when the stress inducing layer is too thin, is not needed depending on thickness of the stress inducing layer 6. FIG. 8 is a schematic cross-sectional illustration of separating a functional layer from the main body 2 of the substrate 1 with a stiff substrate 8 on the epitaxial layer 5, in accordance with an embodiment of the present disclosure. According to an embodiment, a stiff substrate 8 is adhesive on the functional layer. A pulling force is applied for separation. The arrows in FIG. 8 show the pulling directions.

According to an embodiment, the semiconductor substrate 1 is silicon carbide (SiC). As an example, the substrate may be a 2" 6H poly type (0001) SiC substrate. Protons are implanted into the SiC substrate at a 7° incline with respect to the surface of the SiC substrate. The implanted proton energy is 400 keV. The ion dose is $5 \times 10^{16} cm^{-2}$. The protons cause an ion damaged layer 3 in the semiconductor substrate 1 as illustrated in FIG. 3. A suitable heat annealing will enhance the ion damage effect. The annealing temperatures are varied for different substrate materials. To a Si substrate the annealing temperature should be above 218° C. To a SiC substrate, the annealing temperature should be above 650° C. The heat annealing can occur during the process of forming the functional layer. The ion dose should be controlled based on ion energy such as to minimize or prevent surface damage caused by ion gas bubbles and/or spontaneous exfoliation of substrate film, which is the aim for successful application of the embodiments in the present disclosure. After ion implantation, the SiC substrates are placed into MOCVD reactors for epitaxial semiconductor layers (functional layer, in this case) as illustrated in FIG. 5. The epitaxial semiconductor layers 51-54 from bottom to top are AlN buffer layer, Si doped n-type GaN layer, multiple quantum wells $In_xGa_{1-x}N$ and barriers GaN, Mg doped p-type GaN layer, respectively. The total thickness of the epitaxial layer 5 in this embodiment is approximately 4 μm. A stress inducing layer of 10 μm Ni may be sputtered on the epitaxial layer 5. A 200-300 μm copper supporting layer and stress inducing layer is electroplated on Ni stress inducing layer. The main body 2 is thus separated from substrate film 4 and the functional layer on it. The main part of substrate can be re-used with re-polishing.

Figure 4:
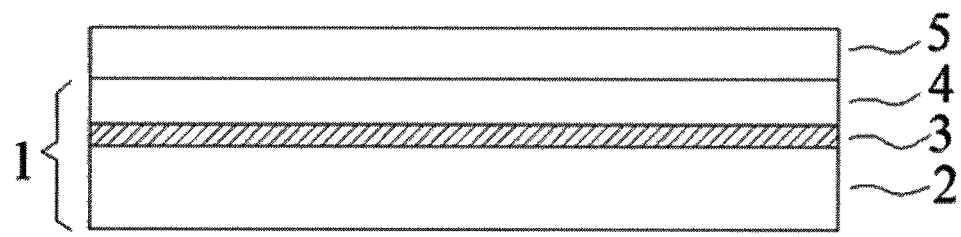
FIG. 4 is a schematic cross-sectional illustration of an epitaxial layer formed on the semiconductor substrate, in accordance with an embodiment of the present disclosure.

In an embodiment in which the semiconductor substrate is 2" 6H poly type (0001) SiC substrate, protons may be implanted into the substrate at an incline of approximately 7° to the surface. The energy and dose of implanted protons may be 500 keV and $7 \times 10^{16} cm^{-2}$, respectively. The protons cause an ion damaged layer in the semiconductor substrate as illustrated in FIG. 3. The ion implanted SiC substrates are placed into MOCVD reactors for epitaxial semiconductor layers (function layer in this case) as illustrated in FIG. 4. The epitaxial semiconductor layers 51-54, from bottom to top, are AN buffer layer, Si doped n-type GaN, multiple quantum wells $In_xGa_{1-x}N$ and barriers GaN, and Mg doped p-type GaN, respectively. The total thickness of the epitaxial layer 5 in this embodiment is approximately 4 μm. A Si substrate may be glued to the functional layer. Two vacuum chucks are attached to the SiC substrate and silicon substrate, respectively. The two vacuum chucks are pulled in opposite directions to separate the functional layer and the substrate film from the main body 2 of semiconductor substrate 1.

As discussed above, the functional layer 5 or blank substrate film 4 can be lifted off from the wafer 1 at ion damaged layer 3. The remaining main body 2 of wafer 1 can be reclaimed and reused for subsequent device fabrication or for film lift off. However, the wafer thickness will decrease after each usage, for example, by a few micrometers to tens of micrometers.

The consumed wafer may be supplemented, on the second side, to keep the wafer thickness in a tolerable range during device fabrication and wafer reclamation, thereby making the wafer last longer. The thickness of the material for supplementing a wafer is not easy to prepare by mechanical techniques in the thickness of micrometers to tens of micrometers. Therefore, ion cut and bonding is a feasible way for compensating the thickness consumption. By supplementing material on the surface of the second side of the wafer, the wafer can be used for device fabrication and film liftoff many more times.

According to an embodiment, a substrate film (without having device fabricated on it) may be lifted off another wafer and bonded to the consumed wafer, thereby forming an engineered wafer. Because the film has been separated from a wafer, it will have more bonding options to attach to another wafer without worry about film breakage during separation like in prior art smart-cut. There are many choices for wafer bonding. According to an embodiment, the wafer bonding can be categorized into direct wafer bonding and wafer bonding with intermediate material. Direct wafer bonding includes (but is not limited to): Fusion Bonding: High and Low Temperature; Chemical Activation; Plasma Activation; Anodic Bonding; Silicon-Glass Laser Bonding. Direct wafer bonding describes the process of bonding two wafers together without any intermediate material. The wafer bonding with intermediate material includes (but is not limited to): Thermo-Compression Bonding; Eutectic Bonding; Polymer Bonding; Metal-Metal Bonding; Solder Bonding; Glass Frit Bonding.

According to embodiments of the present disclosure, an engineered wafer may be formed by first using the separation techniques (described earlier in the present disclosure) to separate the substrate film from one wafer, and then bonding the separated substrate film to the bottom of a consumed wafer for multiple uses. This new bonded wafer is referred to in the present disclosure as an engineered wafer.

The applications are focused on high expensive wafers like SiC or GaN but can be used for other semiconductor materials. Wafer 10 in following text will be SiC, III-N semiconductor materials that is going to be used for device fabrication. Wafer 20 or substrate mentioned below will be the materials such as Si, sapphire, quartz, ceramics or metals for film supplement or film supporting. The material does not need to be added to the backside of the wafer 10 each and every time when wafer 10 is used.

Figure 10:
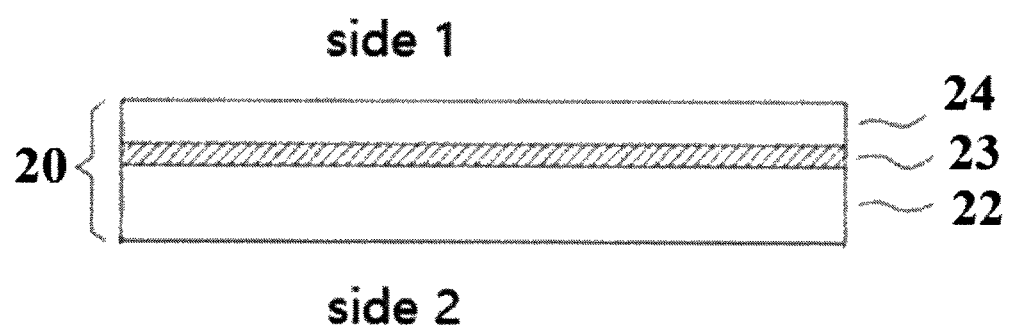
FIG. 10 is a schematic cross-sectional illustration of a second wafer with an ion damaged layer after ion implantation, in accordance with an embodiment of the present disclosure.
Figure 11:
FIG. 11 is a schematic cross-sectional illustration of an engineered wafer in which a substrate film separated from a second wafer is bonded to the second side of the first wafer, in accordance with an embodiment of the present disclosure.

The present disclosure will now describe embodiments for forming engineered wafers in more detail. Similar to FIG. 3, FIG. 10 is a cross-sectional illustration of another semiconductor substrate (i.e. wafer 20) after ion implantation from the first side has formed an ion damaged layer 23, which is above the main body 22 and underneath a substrate film 24. FIG. 11 illustrates an engineered wafer, in which the substrate film 24 from wafer 20 is bonded to the bottom of the first wafer 10. According to an embodiment, wafer 10 comprises GaN or SiC that are in one of the multiple usage techniques described earlier in the present disclosure, i.e. after making and separating the functional layer or film and going to use the wafer in next cycle. According to an embodiment, the implanted ion dosage in wafer 10 and 20 has no limitations for films without functional layer built on it. This is different from previous requirement because heat treatment may not be necessary when ion dose is high.

According to an embodiment, the wafer 10 may or may not already be ion implanted before bonding because wafer 10, like GaN, may have high curvature after high dose ion implantation. According to an embodiment, the second side of wafer 10 is $SiO_2$ coated by plasma enhanced chemical vapor deposition (PECVD), or CVD. According to an embodiment, the first side of wafer 20 is coated with $SiO_2$ by thermal oxidation, CVD, spin-on-glass, or PECVD. The wafer 20 materials may be hetero or homo materials to wafer 10, mono crystalline, poly crystalline or amorphous. According to an embodiment, wafer 10 and wafer 20 are then bonded. After bonding, wafer 20 can be separated from wafer 10 at ion damaged layer 23 of wafer 20 to form an engineered wafer composed of wafer 10 and the supplemented material from wafer 20.

According to an embodiment, the supplement layer (i.e. substrate film 24) from wafer 20 can be separated from wafer 20 (prior to bonding to wafer 10) by applying a stress inducing layer on the surface of the first side of wafer 20, as previously described in the present disclosure. The separated layer from wafer 20 can then be bonded to the second side of wafer 10 to form an engineered wafer by direct bonding, polymer bonding, or fusion bonding. The stress layer can then be removed after bonding.

According to an embodiment, after the supplement layer (i.e. substrate film 24) has been separated from wafer 20, the substrate film 24 and the stress inducing layer 6 together can be bonded to a temporary substrate. Then the stress inducing layer 6 can be removed. The temporary substrate is used for supporting the film 24 after the stress inducing layer is removed and before the film is finally bonded to wafer 10. The temporary substrate may be composed of inexpensive materials such as glass, ceramics, or metals. The surface of the substrate film 24, with stress inducing layer 6 already removed, can be bonded to the second surface of wafer 10. The temporary substrate is then removed after the film 24 is bonded to wafer 10.

According to an embodiment, if wafer 10 is formed of SiC and is used for power device fabrication, the materials for forming wafer 20 should be able to tolerate temperatures for the processes of SiC epitaxy and dopant activations. In this case wafer 20 may be formed of sapphire, $Al_2O_3$ ceramics, poly crystalline SiC, or even metals, like molybdenum, tantalum, etc, according to an embodiment. The bonding may be vacuum bonding or metal fusion bonding using Pt, Cr or V as fusion solders, because the melting points of Pt, Cr and V are all higher than SiC epi and dopant activation temperatures. According to an embodiment, Pt may be desirable because it is softer, and its melting point is lower, than Cr and V, causing less stress at the bonding interface when fusion bonding wafer 10 to the film of wafer 20.

According to an embodiment, the fusion metals can be coated to the second side of wafer 10 and the surface of separated film from wafer 20, by sputtering, or by electron beam evaporation. The second side of wafer 10 and the surface of separated film of wafer 20 can be sputtered or electron bean evaporation coated with metals like Ir, Mo, Ta first, and then coated with the fusion metal to improve wetting for the fusion metals and smearing with the wafers. According to an embodiment, if a thicker layer is needed on the second side of wafer 10, the layer supplemented from wafer 20 can be mechanically prepared. The first side of wafer 10 can then be ion implanted for functional layer separation as described in earlier in the present disclosure. This first side (i.e. application side) of wafer 10 can be used for device fabrication multiple times and will reduce the risk of wafer 10 of breaking down during device fabrication and wafer reclamation.

Figure 12:
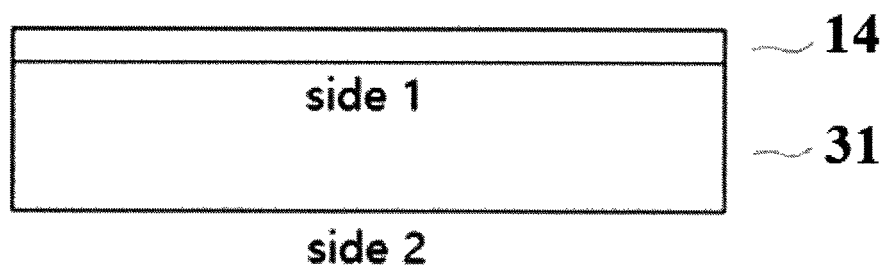
FIG. 12 is a schematic cross-sectional illustration of an engineered wafer in which a substrate film separated from the first wafer is bonded to the first side of a third wafer, in accordance with an embodiment of the present disclosure.

The following embodiments will now describe a second scenario for forming an engineered wafer. According to an embodiment, wafer 10 is ion implanted on the surface of its first side, and a stress inducing layer is applied on the substrate film 14 for separation (similar to FIG. 9). The liftoff film 14 is then bonded to a first side of a substrate 31, and the stress inducing layer 6 is removed after bonding as shown in FIG. 12. According to an alternative embodiment, the liftoff film 14 may first be bonded to a temporary substrate, then the stress inducing layer may be removed, and then the exposed surface of the liftoff film 14 is bonded to the first side of a substrate (i.e. wafer) 31. After the liftoff film 14 (along with the temporary substrate) is bonded to a substrate 31, the temporary substrate is removed.

The bonded film 14 and the substrate 31 forms an engineered wafer and can be used for epitaxial deposition or device fabrication with or without further film surface processing. According to an embodiment, if wafer 10 is formed of GaN or SiC, and the bonded engineered wafer is going to be used for GaN device fabrication, the substrate 31 materials may be Si, sapphire, quartz, ceramics, metal, or such. According to an embodiment, prior to bonding, the surface of the substrate film 14 can be coated with $SiO_2$ by PECVD or CVD; and the first side of substrate 31 is Si dioxide coated by PECVD, CVD or spin-on-glass method. If substrate 31 is Si, the Si dioxide on the first side of substrate 31 may grow with low temperature oxidation. The lift off film can then be bonded to the first side of substrate 31 to form the engineered wafer. According to an embodiment, the film 14 can also be bonded by metal soldering bonding. The solders can be Mn, Ti, Co, or Ni. Except for Mn, the rest of the metals Ti, Co, and Ni can only work with sapphire or high temperature ceramics because their melting points are higher than the melting point of Si.

According to an embodiment, when wafer 10 material is SiC and is going to be used for power devices fabrication, metal solder bonding may be preferred according to an embodiment. The substrate 31 can be sapphire or high temperature ceramics such as $Al_2O_3$, $ZrO_2$, or poly SiC. The separated surface of the film 14 and the first side of substrate 31 can be sputter coated or electron beam evaporation coated with Pt. The film 14 and substrate 31 is heated above the melting point of Pt to solder the film 14 to substrate 31. The separated surface of film 14 and surface of the first side of substrate 31 can also be coated with Mo, Ir, or Ta first, and then coated with Pt for better Pt wetting during fusion bonding.

According to another embodiment, wafer 10 is $n^+$ SiC substrate. The ion is implanted into the first side of wafer 10 first. Then an $n^-$ SiC epitaxial layer is deposited on the surface of the first side of wafer 10. According to an embodiment, the thickness of the $n^-$ epi layer may be 5, 10, 20 or 30 μm. The epitaxial layer and the substrate film above the ion damaged layer in wafer 10 is a functional layer. A stress inducing layer is applied on the functional layer for separation. After separating the functional layer from wafer 10, the surface of the separated functional layer is processed to remove ion damage. Then the surface of the separated functional layer and surface of the first side on substrate 31 are coated with one of the metal Pt, Mo, Ir, Cr, or V. The material of substrate 31 may be Cr, or Mo or some other high melting point metals in this application. Pt is the most favorable solder in this case. The soldering can take place at temperatures equal to or higher than the melting point of Pt by pressing the separated functional film and substrate together. After cool down, the stress inducing layer can be removed from top of the film. An engineered wafer is formed with $n^-$ SiC epitaxial layer on top, $n^+$ SiC at middle and Mo or Cr at bottom. This resulting engineered wafer would be well-suited for making SiC power devices. Typically, a SiC power device has $n^-$ epi layer on $n^+$ substrate. During the device fabrication p type dopant ions are implanted into certain spots of $n^-$ epitaxial layer. The activation of p type dopants usually takes place around the temperature of 1650° C. In addition, the power devices like Schottky diode and MOSFET have vertical structure, i.e. have metal contact both at top and bottom. Metal substrate 31 as a base material can fit for both conductivity and temperature requirements. This engineered wafer can also be built with film 14 from wafer 10 only and has epi layer deposited after wafer has be built.

Figure 13:
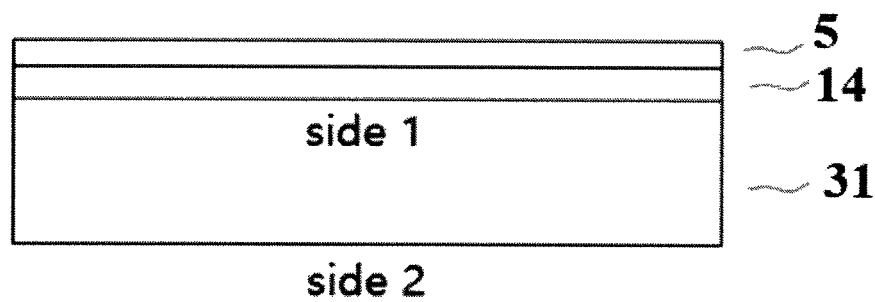
FIG. 13 is a schematic cross-sectional illustration of a functional layer being formed on the substrate film separated from the main body of the first wafer, the functional layer can be formed on the film before or after separation, in accordance with an embodiment of the present disclosure.

FIG. 13 shows the epitaxial layer 5 and film 14 has been separated and bonded to a substrate 31. The substrate 31 can be Cu or other cheap price metals for which melting temperature is not high since the device or epitaxial layer have been built on the film 14 of the wafer 10. The bonding is solder bonding or eutectic boing so that metal substrate can be a function as electrode and heat sink.

According to another embodiment, a functional layer including devices, partially or completely, is fabricated on the surface of first surface of wafer 10. The ions are then implanted through the functional layer and form a ion damaged layer in wafer 10. A stress inducing layer is applied on the functional layer to separate functional layer and a film of substrate. This application is preferable for the devices and epitaxial layer that are not sensitive to ion implantations damages.

According to yet another alternate embodiment, the stress inducing layer can be applied to the opposite side of ion implantation surface (i.e. to the second side). In this case the ion implantation surface needs a stiffener support. The stiffener can be bonded to the surface of the first side by one of fusion bonding, anodic bonding, Si-glass laser bonding, thermal compression bonding, solder bonding, metal-metal bonding, polymer bonding, eutectic bonding, polymer bonding, or glass fit bonding. The stiffener on the ion implantation surface can also be applied by coating a metal or polymer layer on the ion implanted surface and then use vacuum chuck to support.

Various modifications to these embodiments are apparent to those skilled in the art from the description and the accompanying drawings. The principles associated with the various embodiments described herein may be applied to other embodiments. Therefore, the description is not intended to be limited to the embodiments shown along with the accompanying drawings but is to be providing broadest scope of consistent with the principles and the novel and inventive features disclosed or suggested herein. Accordingly, the disclosure is anticipated to hold on to all other such alternatives, modifications, and variations that fall within the scope of the present disclosure and appended claim.

The invention claimed is:

1. A method of forming a semiconductor engineered wafer, the method comprising:
   implanting ions into a donor substrate through a top side, generating an ion damaged layer underneath a substrate film of the donor substrate, wherein the ion dose is controlled based on the ion energy so as to minimize surface damage to the top side of the donor substrate;
   forming a stress inducing layer on a surface on one of the ion implanted side and the opposite side of the donor substrate, the stress inducing layer for introducing compressive stress in the donor substrate;
   separating the substrate film from the donor substrate at the ion damage layer in response to the compressive stress; and
   bonding the separated substrate film after separation to a second wafer at a surface on one of a first side and a second side, the second side being opposite of the first side of the second wafer.

2. The method of claim 1, wherein the bonding step is performed using one of direct wafer bonding and wafer bonding with intermediate materials.

3. The method of claim 1, wherein the materials for the donor substrate comprises at least one of $Si_xGe_{1-x}$, $In_xGa_{1-x}As$, $In_xGa_{1-x}P$, $In_xGa_yAl_{1-x-y}N$, CdTe, ZnO, SiC, and $Ga_2O_3$, where $0 \le x \le 1$, $0 \le y \le 1$ and $0 \le 1-x-y \le 1$ when bonding the donor substrate to the first side of the second wafer.

4. The method of claim 1, wherein the donor substrate is formed of one of Si, sapphire, ceramics, poly crystalline SiC, quartz, glass, and metals when bonding to the second side of the second wafer.

5. The method of claim 1, wherein the implanted ion comprises one of H, He, N, and O.

6. The method of claim 1, wherein a functional layer is formed on the substrate film of the donor substrate prior to applying the stress inducing layer.

7. The method of claim 1, further comprising, prior to implanting ions in the donor substrate, forming a functional layer on a surface of the top side of the donor substrate such that the ions are then implanted through the functional layer.

8. A method of forming a semiconductor engineered wafer, the method comprising:
   providing a donor substrate comprising a first surface on an ion implanted side, a second surface on a side opposite from the ion implanted side, and an ion damaged layer underneath a substrate film of the donor substrate, wherein the ion damaged layer is formed by ion implantation, and wherein the ion dose of the ion implantation is controlled based on the ion energy of the ion implantation so as to minimize surface damage to the first surface of the donor substrate;
   forming a stress inducing layer on a surface on one of the ion implanted side and the opposite side of the donor substrate, the stress inducing layer for introducing compressive stress in the donor substrate; and separating the substrate film from the donor substrate at the ion damage layer in response to the compressive stress;

wherein the semiconductor engineered wafer comprises at least the separated substrate film.

9. The method of claim 8, wherein the materials for the donor substrate comprises at least one of $Si_xGe_{1-x}$, $In_xGa_{1-x}As$, $In_xGa_{1-x}P$, $In_xGa_yAl_{1-x-y}N$, CdTe, ZnO SiC, and $Ga_2O_3$, where $0 \leq x \leq 1$, $0 \leq y \leq 1$ and $0 \leq 1-x-y \leq 1$.

10. The method of claim 8, wherein the implanted ion comprises one of H, He, N, and O.

11. The method of claim 8, wherein a functional layer is formed on the substrate film of the donor substrate prior to applying the stress inducing layer.

12. The method of claim 8, further comprising, prior to implanting ions in the donor substrate, forming a functional layer on a surface of the top side of the donor substrate such that the ions are then implanted through the functional layer.

13. A method of forming a semiconductor engineered wafer, the method comprising:

implanting ions into a donor substrate through a top side, generating an ion damaged layer underneath a substrate film of the donor substrate, wherein the ion dose is controlled based on the ion energy so as to minimize surface damage to the top side of the donor substrate;

forming a stress inducing layer on a surface on one of the ion implanted side and the opposite side of the donor substrate, the stress inducing layer for introducing compressive stress in the donor substrate; and separating the substrate film from the donor substrate at the ion damage layer in response to the compressive stress;

wherein the semiconductor engineered wafer comprises at least the separated substrate film.

14. The method of claim 13, wherein the materials for the donor substrate comprises at least one of $Si_xGe_{1-x}$, $In_xGa_{1-x}As$, $In_xGa_{1-x}P$, $In_xGa_yAl_{1-x-y}N$, CdTe, ZnO, SiC, and $Ga_2O_3$, where $0 \leq x \leq 1$, $0 \leq y \leq 1$ and $0 \leq 1-x-y \leq 1$.

15. The method of claim 13, wherein the implanted ion comprises one of H, He, N, and O.

16. The method of claim 13, wherein a functional layer is formed on the substrate film of the donor substrate prior to applying the stress inducing layer.

17. The method of claim 13, further comprising, prior to implanting ions in the donor substrate, forming a functional layer on a surface of the top side of the donor substrate such that the ions are then implanted through the functional layer.

18. A method of forming a semiconductor engineered wafer, the method comprising:

providing a donor substrate comprising a first surface on an ion implanted side, a second surface on a side opposite from the ion implanted side, and an ion damaged layer underneath a substrate film of the donor substrate, wherein the ion damaged layer is formed by ion implantation, and wherein the ion dose of the ion implantation is controlled based on the ion energy of the ion implantation so as to minimize surface damage to the first surface of the donor substrate;

forming a stress inducing layer on the second surface of the donor substrate, the stress inducing layer for introducing compressive stress in the donor substrate;

wherein the substrate film can be separated from the donor substrate at the ion damage layer in response to the compressive stress.

\* \* \* \* \*